May 3, 1960 E. B. SAUBESTRE 2,935,453

MANUFACTURE OF SEMICONDUCTIVE TRANSLATING DEVICES

Filed April 11, 1957

INVENTOR.
EDWARD B. SAUBESTRE
BY Morton Amster
ATTORNEYS

United States Patent Office 2,935,453 Patented May 3, 1960

2,935,453

MANUFACTURE OF SEMICONDUCTIVE TRANSLATING DEVICES

Edward B. Saubestre, Elmhurst, N.Y., assignor, by mesne assignments, to Sylvania Electric Products Inc., Wilmington, Del., a corporation of Delaware Application April 11, 1957, Serial No. 652,137

2 Claims. (Cl. 204—29)

The present invention is concerned with the manufacture of semiconductive translating devices, such as transistors and diodes, and in particular to an improved method of preparing ohmic contacts of the fast-recombination type on a semiconductive body of silicon and to improve translating devices incorporating such ohmic contacts.

In the manufacture of semiconductor devices, including diodes and transistors and like devices incorporating a body of semiconductive material, it is important to establish an appropriate electrical connection between the external terminals and the internal electrical charge carriers of the semiconductive body. For proper semiconductor operation, it is important that such contact or connection not attenuate the signal or introduce undesirable distortion in the signal. To avoid such effects, the contact established between the external terminal and the semiconductive body is a low-loss or ohmic connection which does not exhibit rectifying properties.

Broadly, it is an object of the present invention to provide an improved contact for connection of external terminals to the semiconductor body of a translating device. Specifically within the contemplation of this invention is the provision of an ohmic contact for connection to a semiconductive body which exhibits a low impedance and signal distortion.

Ohmic contacts for signal input and output to transistors and diodes have been generally classified as being of the fast-recombination type or of the non-injection type. The fast recombination contact is not useful in the neighborhood of a rectifying junction. Thus, wherever a transistor or diode requires a metal contact relatively close to a rectifying junction, the practice is to use the non-injection type of contact.

A fast recombination type of ohmic contact includes a "disturbed" layer interposed between the semiconductor body and the metal, low resistance contact. The disturbed layer is produced by sand blasting, grinding or by otherwise grinding or mechanically working the surface of the semiconductor body before applying to said surface the metal contact. The disturbed layer effectively transmits voltages from the metal contact to the semiconductor body without rectification or distortion and has been found to add only a minimum impedance to the flow of current across the contact. This may be attributed to the fact that the disturbed layer furnishes many recombination centers where excess minority carriers may recombine with majority carriers. Since the action of most transistors and like devices depend upon the emission and collection of minority carriers at their active junctions, the disturbed layer rapidly absorbs minority carriers; and except in the region of a rectifying junction this type of contact is particularly useful in the manufacture of semiconductive devices.

Conventionally, the metal contact is applied by soldering, but since semiconductive surfaces are not readily solderable, it has become the common practice to apply an electrodeposit of a metal such as copper, nickel, gold or the like to the abraded surface before soldering to said surface the external lead or connection.

It is a further object of the present invention to provide an improved method for the manufacture of ohmic contacts of the fast-recombination type on a semiconductive body of silicon. Specifically, it is within the contemplation of this invention to electrodeposit metals on a silicon body in a manner assuring a high degree of adhesion and adherence of the electrodeposited metal to the body.

It is a still further object of the present invention to provide an improved method of manufacturing fast-recombination types of ohmic contacts on silicon semiconductive bodies which will not fail when the devices incorporating such semiconductive bodies are exposed to high processing temperatures and/or a high order of ambient temperature. Advantageously, the processing of silicon semiconductive bodies in accordance with the present invention permits soldering of external connections to the bodies during manufacture of semiconductive devices, without failure of the connection or bond at the interfaces between the silicon bodies and the metal deposits; and use of the resultant semiconductive devices in high temperature installations and environments.

I have found that a number of different metals may be readily electrodeposited on silicon semiconductive bodies with good adhesion by suitably treating in solution the silicon body prior to plating. My solution, which is of hydrofluoric and nitric acid in prescribed proportions, is characterized in that it forms an adherent blue-black or black film covering the disturbed surface of the semiconductive body. Upon electroplating any one of a number of metals onto such adherent blue-black or black film, a high degree of adhesion is obtained at the silicon-electrodeposit interface. Apart from obtaining excellent adhesion, a further important advantage realized by my improved process is that the plating of the contact metal may take place from any conventional plating bath, requiring no special formulation or precautionary measures other than those normally employed in the handling of such conventional plating baths.

The exact composition of my improved hydrofluoric-nitric acid solution depends somewhat on the purity and nature of the surfaces of the silicon body under treatment, but it has been found that the concentration of the acids will lie in the range of 92 to 98 parts by volume of hydrofluoric acid (48% wt.) and 2 to 8 parts by volume of nitric acid (70% wt.).

The exact composition of my hydrofluoric-nitric acid solution for a given silicon surface may be determined by adding nitric acid to the solution during processing until a point is reached at which gassing occurs over the surface of the silicon body and a uniform thin black or blue-black film is formed over the surfaces under treatment. Two particular formulations which have been found to be particularly useful are 95 parts by volume of hydrofluoric acid (48% wt.) and 5 parts by volume of nitric acid (70% wt.); and 97.5 parts by volume of hydrofluoric acid (48% wt.) and 2.5 parts of nitric acid (70% wt.). Although these particular formulations have been found to be particularly suitable, the useful range is previously defined and accordingly there are a number of formulations which may be employed. Although silicon etches are commonly employed in the art for imparting desirable electrical properties to semiconductive surfaces, which etches contain hydrofluoric and nitric acids, the proportions employed are from 9:1 to 1:16 parts by weight of hydrofluoric acid to nitric acid. Despite the usefulness of etches in this range for semiconductive work in general, the surfaces so produced are unsuitable for subsequent electroplating. Electrodeposits obtained with such preliminary treatment are poorly adherent and do not provide the excellent adhesion between the silicon-electrodeposit interface as with my improved hydrofluoric-nitric acid solution.

In accordance with the illustrative process, an ohmic contact of the fast recombination type is formed on a semiconductive body of silicon by first treating a surface of the body to form a disturbed layer, as for example by mechanically grinding or abrading the surface. The disturbed layer is then exposed to a hydrofluoric-nitric acid solution under conditions selected to produce an adherent black or blue-black film on the disturbed layer. Thereafter, a metal plating is formed on the adherent film to complete the required ohmic contact which is bonded to the body by the adherent film.

The above brief description as well as further objects, features and advantages of the present invention, in its various aspects, may be best appreciated by reference to the following detailed description of illustrative semiconductive devices and methods, when taken in conjunction with the accompanying drawing, wherein.

Figure 1:
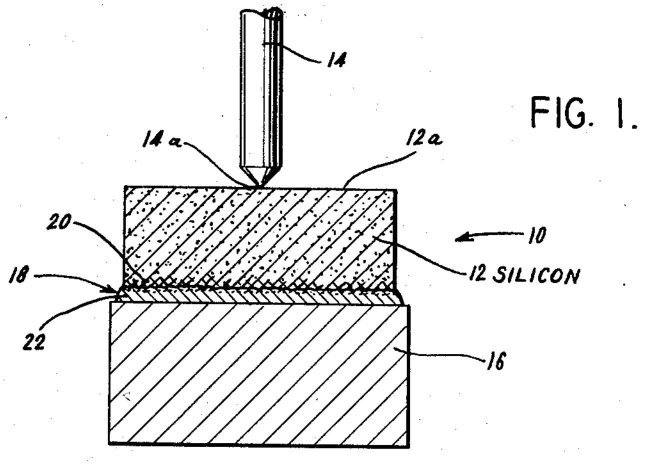
Fig. 1 is a diagrammatic showing of a typical point-contact diode incorporating a fast recombination type of ohmic contact prepared in accordance with the present invention.

Referring now specifically to the drawings, there is shown in Fig. 1, a typical point-contact diode, generally designated by the reference numeral 10, which includes a semiconductive body 12 of silicon, a point contact 14 and a base electrode 16. The surface 12*a* of the silicon body 12 has a rectifying junction at the point 14*a* of the contact 14, as is well understood. The semiconductive body incorporates an ohmic contact of the fast recombination type, generally designated by the reference numeral 18, between the silicon body 12 and the base electrode 16. The ohmic contact 18 incorporates a mechanically disturbed layer 20 formed on the undersurface of the silicon body 12 and a metal plating 22 covering the disturbed layer. The metal plating 22 may be of copper, nickel, zinc, gold, rhodium, and is employed to solder the base electrode 16 to the silicon body 12. The type of metal employed in the electrodeposit 22 is of course determined by the construction of the point-contact diode 10, particularly the material of the base electrode 16.

Figure 2:
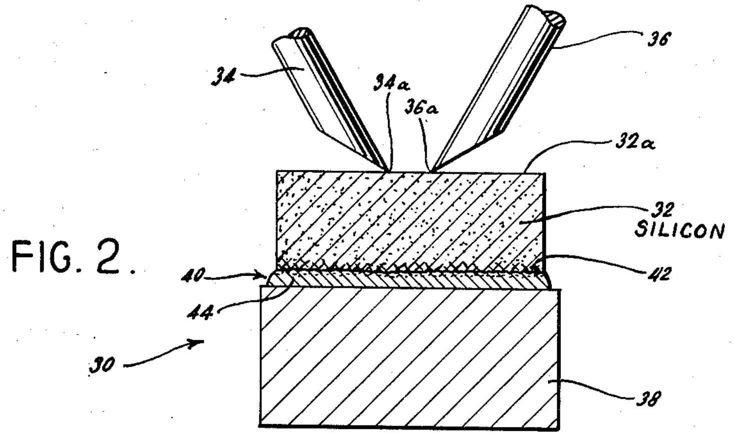
Fig. 2 is a diagrammatic showing of a point-contact transistor incorporating a fast-recombination type of ohmic contact prepared in accordance with the present invention; and, Fig. 3 is a diagrammatic showing of a typical grown junction diode incorporating respective fast recombination ohmic contacts at the opposite ends of the semiconductive body.

In Fig. 2 there is shown a point-contact transistor 30 which includes a silicon semiconductive body 32, an emitter electrode 34, a collector electrode 36 and a base electrode 38. Respective junctions are provided on the face 32*a* of the semiconductive body at the points 34*a*, 36*a* of the point-contact electrodes. In this embodiment, the silicon body is joined to the base electrode 38 by an ohmic contact 40 of the fast recombination type which incorporates a disturbed layer 42 coextensive with the undersurface of the silicon body 32 and a plating 44 which enables soldering of the base electrode 38 to the silicon body 32.

Figure 3:
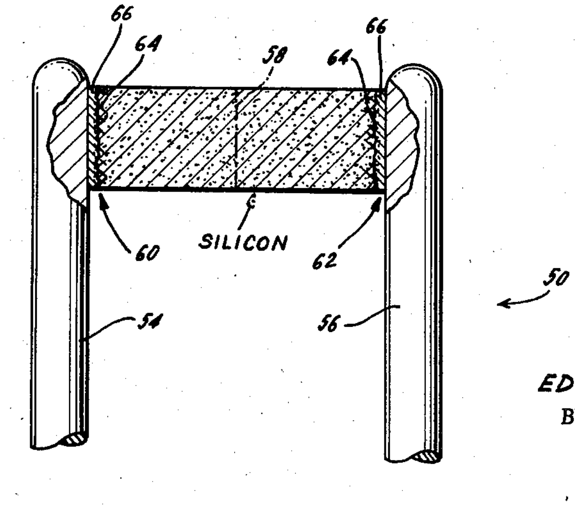

In Fig. 3 there is illustrated a grown junction diode, generally designated by the reference numeral 50, which incorporates a semiconductive body 52 and two electrodes 54, 56. The semiconductive body 52 is of silicon and is grown to incorporate regions of opposite conductivity type which adjoin at a junction 58 substantially midway between the opposite ends of the semiconductive body 52. The electrodes 54, 56 are joined to the opposite ends of the semiconductive body by ohmic contacts 60, 62 of the fast recombination type each of which incorporates a disturbed layer 64 and an electrodeposit of an appropriate metal 66 which enables the soldering of the adjacent electrode to the semiconductive body.

In the typical, but nonetheless illustrative translating devices of Figs. 1 to 3, inclusive, it is to be observed that the fast recombination type of contact is spaced from any rectifying junction of the device. As is understood, the disturbed layer which is part of the fast recombination type of contact furnishes many "recombination centers" where excess minority carriers may recombine with majority carriers. Thus, any minority carriers introduced from the metal are rapidly absorbed and signal transmission is effected from the metal contact to the semiconductor body without rectification or signal distortion and with but a minimum of current flow across the contact. Apart from being a good absorber of minority carriers, the disturbed layer is likewise a good radiator of minority carriers, many of which diffuse away and would present problems if such disturbed layers were close to a rectifying junction. It is for this reason that the described fast recombination contact is limited in its use to situations where the contact is not in the neighborhood of a rectifying junction, as contrasted to the "non-injecting" type of contact which is useful in regions proximate to rectifying junctions.

The various illustrative fast recombination junctions incorporated in the devices in Figs. 1 to 3, inclusive, may be prepared by the following sequence of steps:

Initially the silicon semiconductor body is ground or abraded on one surface, such grinding or abrading being effective to form the required mechanically disturbed layer. Such mechanical working of the semiconductor surfaces has the effect of producing discontinuities in the lattice structure of the semiconductor body for a short distance below the surface. Small cracks are thus created and the otherwise continuous crystalline arrangement of the semiconductive body is broken upon into many tiny particles which lose their orientation with respect to each other in the main crystalline lattice of the semiconductive body, thus providing the many recombination centers for collecting excess minority carriers.

The mechanically disturbed surface is then immersed in my improved hydrofluoric-nitric acid solution in which the hydrofluoric acid (48% wt.) is present between 92 to 98 parts by volume and the nitric acid (70% wt.) is present between 2 to 8 parts by volume. As previously indicated, the exact composition of the solution for any given silicon surface may be determined by adding nitric acid to the solution until the point is reached at which gassing occurs over the disturbed surface and a uniform thin black or blue-black film is formed over the disturbed surface. Illustrative compositions useful are 95% hydrofluoric acid, 5% nitric acid; and 97.5% hydrofluoric acid and 2.5% of nitric acid.

Following the treatment with solution until the formation of the required adherent black or blue-black film, the semiconductive body is immersed in water to stop off the action of the solution. The thus prepared surface is formed with an electrodeposit of any suitable metal, such as copper, nickel, zinc, gold and rhodium by using conventional baths and conventional processing with said baths. If the plating bath is to be alkaline, it is desirable to precede the plating step with dip of the semiconductive body in alkaline solution followed by a water rinse.

A latitude of modification, change and substitution is intended in the foregoing disclosure and in some instances some features of my improved method may be used without a corresponding use of other features. Accordingly, it is appropriate that the appended claims be construed broadly and in a manner consistent with the spirit and scope of the invention herein.

What I claim is:

1. In the manufacture of semiconductive translating devices an improved method for the preparation of an ohmic metallic contact on a surface of a semiconductive silicon body including the steps of forming a disturbed layer on said surface of said body, treating said surface with a hydrofluoric-nitric acid solution containing between 92 to 98 parts by volume of hydrofluoric acid and between 2 to 8 parts by volume of nitric acid to form an adherent blue-black film on said surface, and thereafter plating a metallic contact onto said film.

2. In the manufacture of semiconductive translating devices an improved method for the preparation of an ohmic metallic contact on a surface of a semiconductive silicon body including the steps of forming a disturbed layer on said surface of said body, treating said surface with a hydrofluoric-nitric acid solution containing between 92 to 98 parts by volume of hydrofluoric acid and between 2 to 8 parts by volume of nitric acid to form an adherent blue-black film on said surface, stopping off the action of said solution, and thereafter plating a metallic contact onto said film.

References Cited in the file of this patent

UNITED STATES PATENTS

| | | |
|---|---|---|
| 2,437,269 | Ohl | Mar. 8, 1948 |
| 2,705,192 | Faust et al. | Mar. 29, 1955 |
| 2,740,700 | Fuller | Apr. 3, 1956 |
| 2,793,420 | Johnston et al. | May 28, 1957 |
| 2,796,564 | Dymon | June 18, 1957 |